(12) United States Patent
Lee et al.

(10) Patent No.: US 11,653,523 B2
(45) Date of Patent: May 16, 2023

(54) DISPLAY DEVICE

(71) Applicant: Samsung Display Co., Ltd., Yongin-Si (KR)

(72) Inventors: Changho Lee, Busan (KR); Eunyoung Kim, Asan-si (KR); Gyeongnam Bang, Seoul (KR); Hyeyun Han, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/177,832

(22) Filed: Feb. 17, 2021

(65) Prior Publication Data

US 2021/0257592 A1    Aug. 19, 2021

(30) Foreign Application Priority Data

Feb. 18, 2020 (KR) .................. 10-2020-0019363

(51) Int. Cl.
*H01L 51/52* (2006.01)
*G06F 3/044* (2006.01)
*H01L 27/32* (2006.01)
*G06F 3/041* (2006.01)

(52) U.S. Cl.
CPC ........ *H01L 51/5253* (2013.01); *G06F 3/0412* (2013.01); *G06F 3/0443* (2019.05); *H01L 27/323* (2013.01); *G06F 3/0446* (2019.05)

(58) Field of Classification Search
None
See application file for complete search history.

(56) References Cited

U.S. PATENT DOCUMENTS

| | | | |
|---|---|---|---|
| 10,454,067 B2 | 10/2019 | Seo et al. | |
| 2016/0299611 A1* | 10/2016 | Park | H01L 51/5237 |
| 2017/0287992 A1 | 10/2017 | Kwak et al. | |
| 2018/0090517 A1* | 3/2018 | Park | H01L 51/5246 |
| 2019/0051859 A1* | 2/2019 | Choi | H01L 51/5253 |
| 2019/0081118 A1 | 3/2019 | Oh et al. | |
| 2019/0157607 A1 | 5/2019 | Kim et al. | |
| 2019/0326360 A1* | 10/2019 | Gwon | G06F 3/0412 |
| 2020/0173949 A1 | 6/2020 | Lee et al. | |
| 2020/0273919 A1* | 8/2020 | Ding | H01L 51/5253 |

FOREIGN PATENT DOCUMENTS

| | | |
|---|---|---|
| KR | 10-2017-0111827 | 10/2017 |
| KR | 10-2019-0030798 | 3/2019 |
| KR | 10-2019-0056473 | 5/2019 |
| KR | 10-2019-0059708 | 5/2019 |

* cited by examiner

*Primary Examiner* — Christopher R Lamb
(74) *Attorney, Agent, or Firm* — F. Chau & Associates, LLC

(57) ABSTRACT

A display device includes: a display panel including a base layer, a circuit layer, a display element layer, and an encapsulation layer, wherein a through-hole passes through the base layer, the circuit layer, the display element layer and the encapsulation layer; a compensation layer disposed on the encapsulation layer, wherein the compensation layer is adjacent to the through-hole; and a crack detection pattern disposed in a groove on a top surface of the compensation layer.

19 Claims, 10 Drawing Sheets

DISPLAY DEVICE

CROSS-REFERENCE TO RELATED APPLICATION

This U.S. non-provisional patent application claims priority under 35 U.S.C. § 119 to Korean Patent Application No. 10-2020-0019363, filed on Feb. 18, 2020, the disclosure of which is incorporated by reference herein in its entirety.

TECHNICAL FIELD

The present inventive concept relates to a display device having a crack detection function.

DISCUSSION OF RELATED ART

A display device is an output device for presentation of information in visual form. The display device may include various electronic components such as a display panel for displaying an image, an input sensor for detecting an external input, and an electronic module. The electronic components may be electrically connected to each other by signal lines. The electronic module may include a camera, an infrared detection sensor, or a proximity sensor. The electronic module may be disposed below the display panel and the input sensor. A hole for exposing the electronic module may be provided in the display panel and the input sensor. However, a crack may occur in the display panel during the formation of the hole for exposing the electronic module.

SUMMARY

An embodiment of the inventive concept provides a display device including: a display panel including a base layer, a circuit layer, a display element layer, and an encapsulation layer, wherein a through-hole passes through the base layer, the circuit layer, the display element layer and the encapsulation layer; a compensation layer disposed on the encapsulation layer, wherein the compensation layer is adjacent to the through-hole; and a crack detection pattern disposed in a groove on a top surface of the compensation layer.

A portion of the compensation layer may be disposed between the crack detection pattern and the base layer.

The crack detection pattern may not overlap the compensation layer when viewed from the top surface of the compensation layer.

The base layer may include a plurality of base grooves on a top surface of the base layer adjacent to the through-hole, and the crack detection pattern overlaps one base groove of the plurality of base grooves.

The crack detection pattern may be disposed in the one base groove.

The through-hole may include a first sidewall and a second sidewall adjacent to the first sidewall, and the crack detection pattern may include a first pattern portion disposed around the first sidewall, a second pattern portion connected to the first pattern portion and disposed around the first sidewall and the second sidewall, and a third pattern portion connected to the second pattern portion and disposed around the second sidewall, wherein the second pattern portion may be disposed between the first pattern portion and the first sidewall and between the third pattern portion and the second sidewall.

The first pattern portion, the second pattern portion, and the third pattern portion may be disposed in the groove.

The groove may include a first groove portion disposed around the first sidewall, a second groove portion connected to the first groove portion and disposed around the first sidewall and the second sidewall, and a third groove portion connected to the second groove portion and disposed around the second sidewall, wherein the first pattern portion may be disposed in the first groove portion, the second pattern portion is disposed in the second groove portion, and the third pattern portion is disposed in the third groove portion.

The groove may surround the entire through-hole.

The groove may surround only a portion of the through-hole.

An active area configured to display an image and a peripheral area adjacent to the active area may be provided on the display panel, and the through-hole may be surrounded by the active area.

The display device may further include: a first crack detection line connected to the crack detection pattern; a second crack detection line connected to the crack detection pattern; a first connection line connected to the crack detection pattern and the first crack detection line; and a second connection line connected to the crack detection pattern and the second crack detection line.

The display device may further include: a first sensing electrode disposed on the display panel and comprising first sensing patterns and a first connection pattern connected to the first sensing patterns; and a second sensing electrode disposed on the display panel and comprising second sensing patterns and a second connection pattern disposed on a different layer from the first connection pattern and connected to the second sensing patterns, wherein the crack detection pattern is disposed on the same layer as the first connection pattern or the second connection pattern.

An embodiment of the inventive concept provides a display device including: a display panel including a base layer, a circuit layer, a display element layer, and an encapsulation layer, wherein a through-hole passes through the base layer, the circuit layer, the display element layer and the encapsulation layer; a compensation layer disposed on the display panel and surrounding the through-hole; and an input sensor comprising a crack detection pattern disposed in a groove at a top surface of the compensation layer and a plurality of sensing electrodes.

The plurality of sensing electrodes may include a first sensing electrode including first sensing patterns and a first connection pattern connected to the first sensing patterns and a second sensing electrode comprising second sensing patterns and a second connection pattern disposed on a different layer from the first connection pattern and connected to the second sensing patterns, wherein the crack detection pattern is disposed on the same layer as the first connection pattern or the second connection pattern.

In a direction from the top surface of the compensation layer to the base layer, the groove overlaps the compensation layer or the groove does not overlap the compensation layer.

The base layer may include a plurality of base grooves at a top surface of the base layer, wherein the plurality of base grooves surround the through-hole, and the crack detection pattern overlaps one base groove of the plurality of base grooves.

The crack detection pattern may be disposed in the one base groove.

An embodiment of the inventive concept provides a display device including: a base layer including a hole; a compensation layer disposed on the base layer and surrounding a peripheral portion of the hole, wherein the compensation layer includes a groove recessed from a top surface thereof; a crack detection pattern disposed in the groove; a first crack detection line connected to a first end of the crack detection pattern; and a second crack detection line connected to a second end of the crack detection pattern.

The groove overlaps the compensation layer or does not overlap the compensation layer.

An embodiment of the inventive concept provides a display device includes: a display panel including a base layer and an encapsulation layer; a compensation layer disposed on the encapsulation layer, the compensation layer including a groove; an input sensor disposed on the compensation layer and in the groove; and a crack detection pattern disposed in the groove.

The crack detection pattern may be conductive.

The groove may be adjacent to a sidewall of a through-hole passing through the display panel, the compensation layer and the input sensor.

The compensation layer may be disposed between the sidewall and the groove.

The groove may overlap a base groove in the base layer.

BRIEF DESCRIPTION OF THE FIGURES

The above and other features of the inventive concept will become more apparent by describing in detail embodiments thereof with reference to the accompanying drawings. In the drawings.

DETAILED DESCRIPTION OF THE EMBODIMENTS

Figure 1:
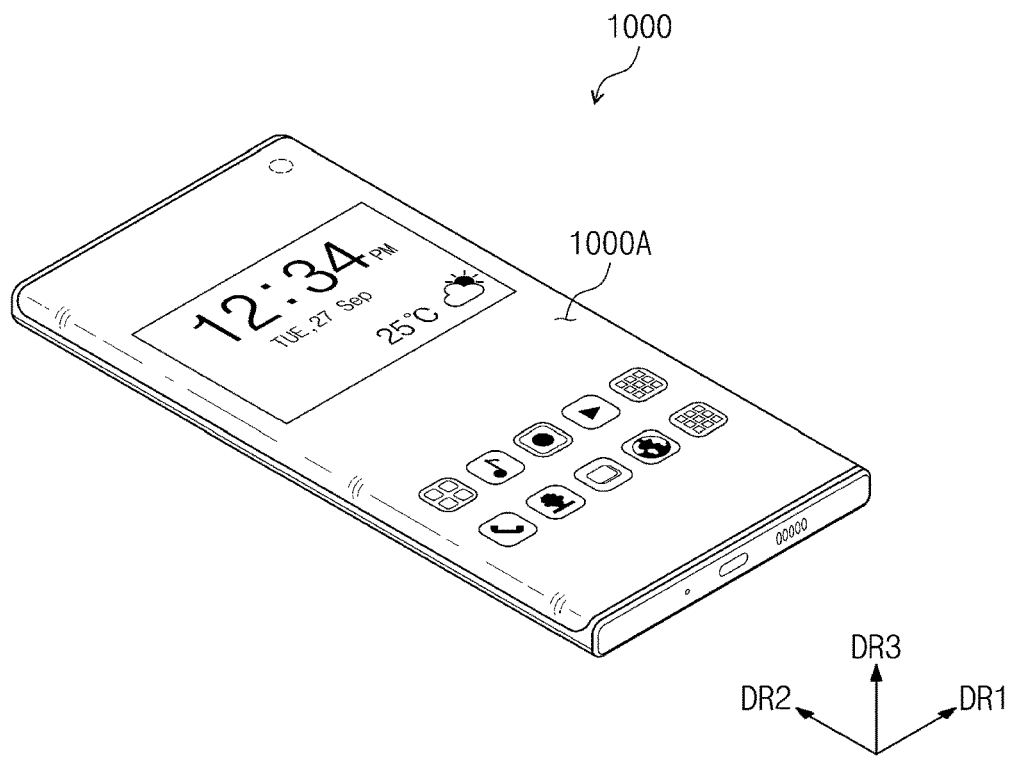
FIG. 1 is a perspective view illustrating a display device according to an embodiment of the inventive concept.

In this specification, it will also be understood that when one component (or region, layer, portion) is referred to as being 'on', 'connected to', or 'coupled to' another component (or region, layer, portion), it can be directly disposed/connected/coupled on/to the other component (or region, layer, portion), or an intervening component (or region, layer, portion) may also be present.

Like reference numerals may refer to like elements throughout this disclosure. In addition, in the figures, the thickness, ratio, and dimensions of components may be exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in one embodiment can be referred to as a second element in another embodiment without departing from the scope of the appended claims.

The terms of a singular form may include plural forms unless referred to the contrary.

Also, ""under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

The meaning of 'include' or 'comprise' specifies a property, a fixed number, a step, an operation, an element, a component or a combination thereof, but does not exclude other properties, fixed numbers, steps, operations, elements, components or combinations thereof.

Hereinafter, embodiments of the inventive concept will be described with reference to the accompanying drawings.

FIG. 1 is a perspective view illustrating a display device according to an embodiment of the inventive concept.

Referring to FIG. 1, a display device 1000 may be activated according to an electrical signal. FIG. 1 illustrates a mobile phone as an example of the display device 1000. However, the inventive concept is not limited thereto and the display device 1000 may be a mobile phone, a tablet computer, a navigation unit for a vehicle, a game console, or a wearable device.

The display device 1000 may display an image through an active area 1000A. The active area 1000A may include a plane formed along a first direction DR1 and a second direction DR2. The active area 1000A may further include curved surfaces that are bent from at least two sides of the plane, respectively. For example, the curved surfaces may be provided at opposite long sides of the plane. However, the inventive concept is not limited to the shape of the active area 1000A. For example, the active area 1000A may include only the plane without curved surfaces or further include at least two curved surfaces of the plane, e.g., four curved surfaces bent from four sides of the plane, respectively. An area surrounding or adjacent to the active area 1000A may be referred to as a peripheral area in which an image is not displayed.

The display device 1000 may have a thickness direction parallel to a third direction DR3 crossing the first direction DR1 and the second direction DR2. A front surface (or top surface) and a rear surface (or bottom surface) of each member of the display device 1000 may be described with respect to the third direction DR3.

Figure 2:
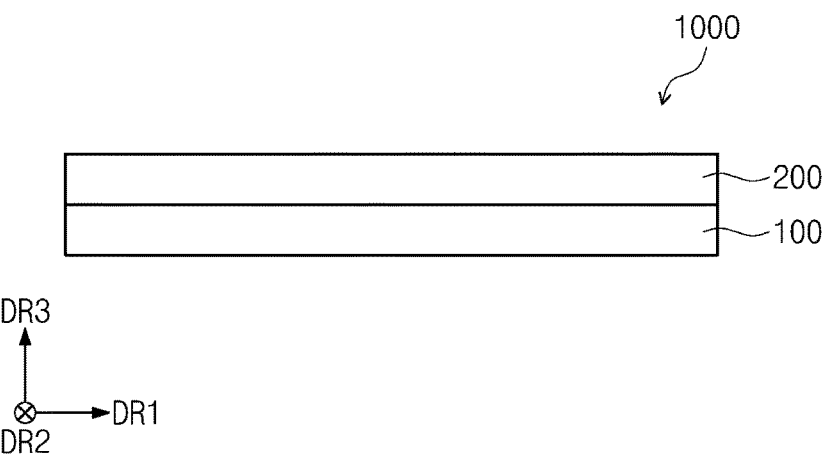
FIG. 2 is a schematic cross-sectional view illustrating the display device according to an embodiment of the inventive concept.

FIG. 2 is a schematic cross-sectional view illustrating a partial configuration of the display device according to an embodiment of the inventive concept.

Referring to FIG. 2, the display device 1000 may include a display panel 100 and an input sensor 200.

The display panel 100 may be a component that generates an image. The display panel 100 may be a light emitting display panel. For example, the display panel 100 may be an organic light emitting display panel or a quantum dot light emitting display panel. Alternatively, the display panel 100 may be a light receiving display panel. For example, the display panel 100 may be a liquid crystal display panel which receives light from a backlight.

The input sensor 200 may be disposed on the display panel 100. For example, the input sensor 200 may overlap the display panel 100. The input sensor 200 may detect an external input applied from the outside. The external input may be an input of a user. For example, the input of the user may include various types of external inputs such as a portion of a user's body, light, heat, a pen, or pressure. The input of the user may be sensed by the input sensor 200 when, for example, a portion of the user's body contacts or comes into proximity with the input sensor 200.

The input sensor 200 may be disposed on the display panel 100. Alternatively, the input sensor 200 may be coupled with the display panel 100 through an adhesive member. In other words, the adhesive member may be located between the input sensor 200 and the display panel 100. The adhesive member may include a general adhesive or sticking agent. For example, the adhesive member may be a transparent adhesive member such as a pressure sensitive adhesive film (PSA), an optically clear adhesive film (OCA), or an optically clear resin (OCR).

The display device 1000 may further include a window disposed on the input sensor 200. The window may include an optically clear insulating material such as glass or plastic. The window may have a multilayer or single-layer structure. The window may protect the input sensor 200 and the display panel 100.

Figure 3:
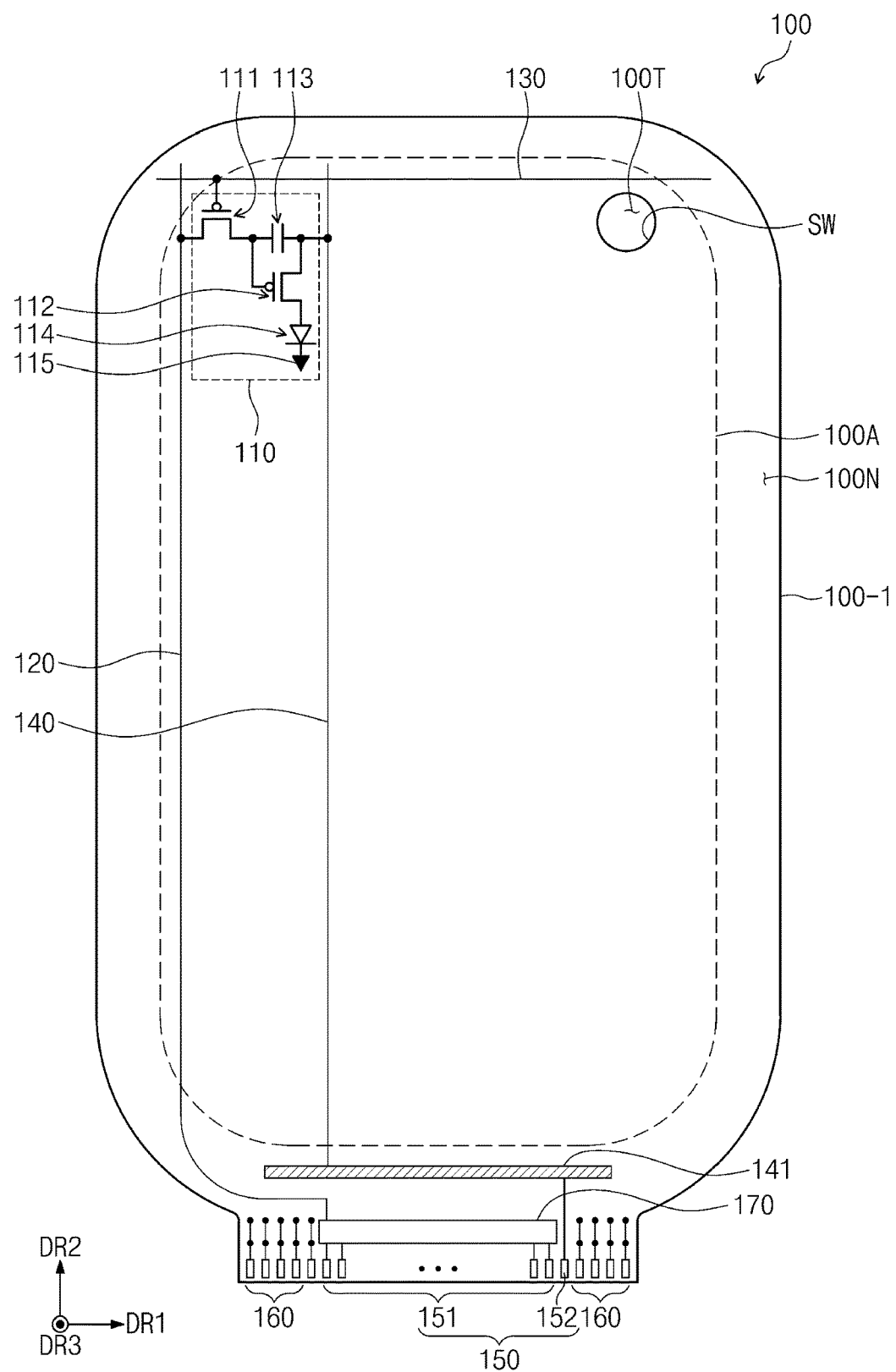
FIG. 3 is a plan view illustrating a display panel according to an embodiment of the inventive concept.

FIG. 3 is a plan view illustrating the display panel according to an embodiment of the inventive concept.

Referring to FIG. 3, an active area 100A and a peripheral area 100N are provided on the display panel 100. The active area 100A may be activated according to an electrical signal. For example, the active area 100A may display an image. The peripheral area 100N may surround the active area 100A. A driving circuit or a driving line for driving the active area 100A may be disposed on the peripheral area 100N.

A through-hole 100T may be provided in the active area 100A of the display panel 100. The through-hole 100T may be surrounded by the active area 100A. However, the inventive concept is not limited thereto. For example, a portion of the through-hole 100T may contact the active area 100A, and another portion may contact the peripheral area 100N. In another example, the through-hole 100T may be entirely located in the peripheral area 100N.

The through-hole 100T may be a space to which an external signal inputted to an electronic module or a signal outputted from the electronic module is transmitted. For example, the electronic module may be a camera module.

The through-hole 100T may be formed by removing all or at least some of components of the display panel 100. The through-hole 100T may have the shape of a circle, an oval, a polygon, or a polygon having at least one curved side. However, the inventive concept is not limited thereto.

The display panel 100 may include a base layer 100-1, a plurality of pixels 110, a plurality of signal lines 120, 130, and 140, a plurality of display pads 150, and a plurality of sensing pads 160. The pixels 110 may be located in the active area 100A, the signal lines 120, 130, and 140 may be located in both the active area 100A and the peripheral area 100N and the display pads 150 and sensing pads 160 may be located in the peripheral area 100N.

The base layer 100-1 may include a glass substrate, an organic/inorganic composite substrate, or a synthetic resin film. The synthetic resin film may include a thermosetting resin. The base layer 100-1 may have a multilayer structure. For example, the base layer 100-1 may have a three-layer structure of a synthetic resin layer, an adhesive layer, and a synthetic resin layer. The synthetic resin layer may include a polyimide-based resin layer; however, the inventive concept is not limited to the material of the synthetic resin layer. The synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin.

The signal lines 120, 130, and 140 are connected to the pixels 110 and transmit electrical signals to the pixels 110. FIG. 3 exemplarily illustrates that the signal lines 120, 130, and 140 include a data line 120, a scan line 130, and a power line 140. However, this is merely illustrative. The signal lines 120, 130, and 140 may further include at least one of an initialization voltage line and a light emitting control line. However, the inventive concept is not limited thereto.

The pixels 110 may be disposed on the active area 100A. In this embodiment, an enlarged circuit diagram of one pixel 110 of the plurality of pixels is exemplarily illustrated.

The pixel 110 may include a first transistor 111, a second transistor 112, a capacitor 113, and a light emitting element 114. The first transistor 111 may be a switching element for controlling the turning on-off of the pixel 110. The first transistor 111 may transmit or block a data signal transmitted through a data line 120 in response to a scan signal transmitted through a scan line 130. The first transistor 111 may be an N-type metal oxide semiconductor (NMOS) or a P-type metal oxide semiconductor (PMOS) transistor.

The capacitor 113 may be connected to the first transistor 111 and the power line 140. For example, a first terminal of the capacitor 113 may be connected to the first transistor 111 and a second terminal of the capacitor 113 may be connected to the power line 140. The capacitor 113 stores a charge amount corresponding to a difference between the data signal transmitted from the first transistor 111 and a first power signal applied to the power line 140.

The second transistor 112 may be connected to the first transistor 111, the capacitor 113, and the light emitting element 114. For example, the second transistor 112 may be connected to the first and second terminals of the capacitor 113. The second transistor 112 controls a driving current flowing through the light emitting element 114 in correspondence to a charge amount stored in the capacitor 113. A turn-on time of the second transistor 112 may be determined according to the charge amount stored in the capacitor 113. The second transistor 112 may provide the first power signal transmitted through the power line 140 during the turn-on time to the light emitting element 114.

The light emitting element 114 may generate light or control a light quantity according to an electrical signal. For example, the light emitting element 114 may include an organic light emitting element, a quantum dot light emitting element, a micro-light emitting diode (LED) light emitting element, or a nano-LED light emitting element.

The light emitting element 114 may be connected to a power terminal 115 and receive a power signal (hereinafter, a second power signal or a ground voltage) that is different from the first power signal and provided by the power line 140. As a driving current corresponding to a difference between the second power signal and an electrical signal provided from the second transistor 112 flows through the light emitting element 114, the light emitting element 114 may generate light corresponding to the driving current.

The configuration of the pixel 110 is merely illustrative. For example, the pixel 110 may include electronic elements having various other configurations and arrangements, and thus, the inventive concept is not limited to the pixel circuit shown in FIG. 3. For example, the pixel 110 may have an equivalent circuit including seven transistors and one capacitor, and the equivalent circuit of the pixel 110 may be variously changed.

The display pads 150 may include a first pad 151 and a second pad 152. The first pad 151 may be provided in plural, and the plurality of first pads 151 may be connected to the data lines 120. The second pad 152 may be electrically connected to the power line 140 through a power pattern 141. The second pad 152 may be disposed adjacent to one of the first pads 151. In an embodiment of the inventive concept, the power pattern 141 may be omitted.

The display panel 100 may provide electrical signals provided from the outside through the display pads 150 to the pixels 110. The display pads 150 may further include pads for receiving other electrical signals in addition to the first pad 151 and the second pad 152.

A driving chip 170 may be mounted on the peripheral area 100N of the display panel 100. The driving chip 170 may be a chip-type timing control circuit. In this case, the data lines 120 may be electrically connected to the first pads 151 through the driving chip 170. However, this is merely illustrative. Alternatively, the driving chip 170 may be mounted on a film separated from the display panel 100. In this case, the driving chip 170 may be electrically connected to the display pads 150 through the film.

The plurality of sensing pads 160 may be electrically connected to sensing electrodes of a sensor that will be described later. Among the plurality of sensing pads 160, a first portion of the sensing pads 160 (e.g., the sensing pads 160 to the left of the driving chip 170) and a second portion of the sensing pads 60 (e.g., the sensing pads 160 to the right of the driving chip 170) may be spaced apart from each other with the display pads 150 therebetween. However, the inventive concept is not limited thereto. For example, an arrangement relationship between the sensing pads 160 and the display pads 150 may be variously changed. For example, the sensing pads 160 may be located on just one side of the display pads 150.

Figure 4:
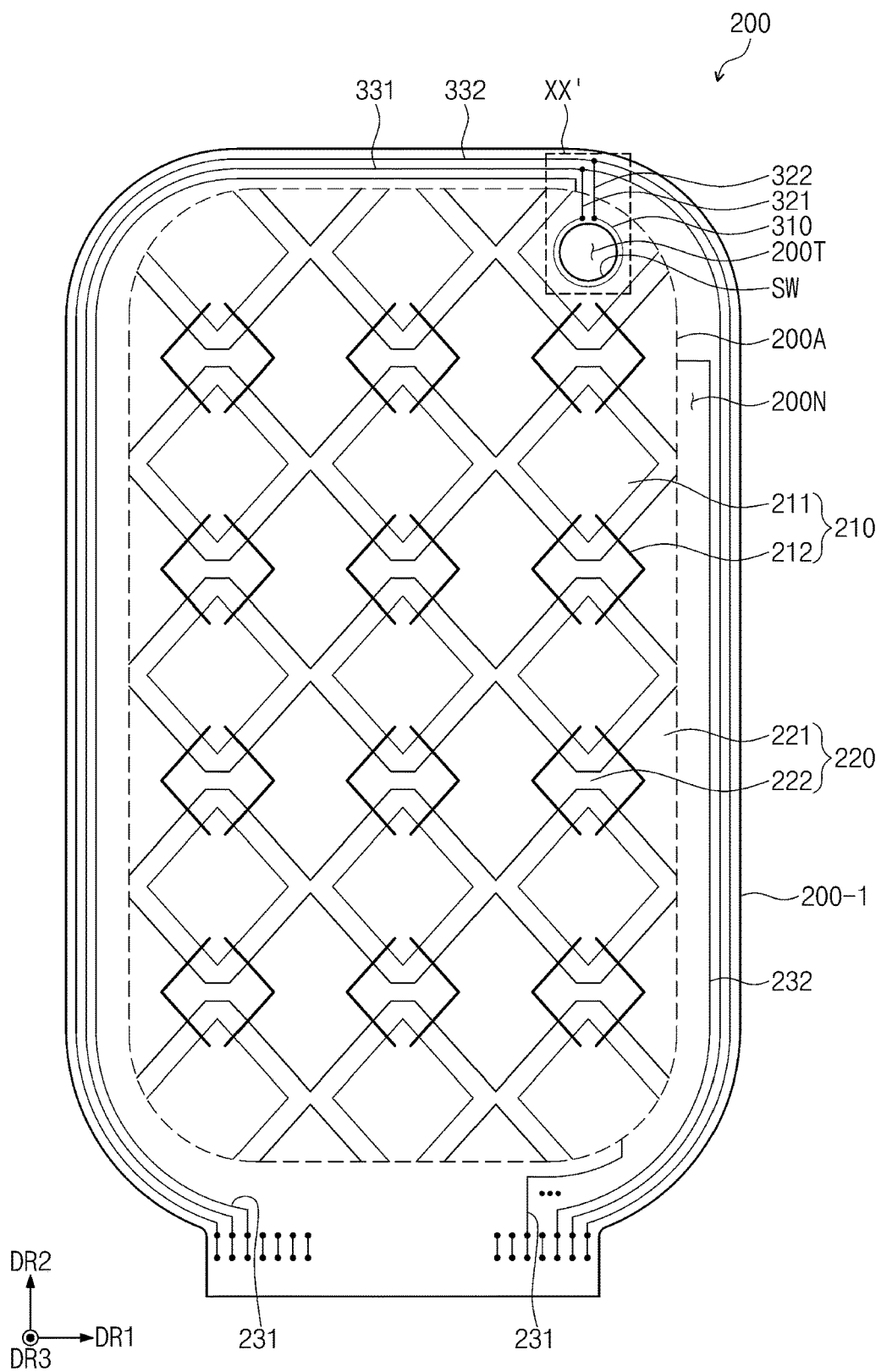
FIG. 4 is a plan view illustrating an input sensor according to an embodiment of the inventive concept.

FIG. 4 is a plan view illustrating an input sensor according to an embodiment of the inventive concept.

Referring to FIG. 4, an active area 200A and a peripheral area 200N may be provided on the input sensor 200. The active area 200A may be activated according to an electrical signal. For example, the active area 200A may detect an external input. The peripheral area 200N may surround the active area 200A.

A through-hole 200T may be provided in the active area 200A of the input sensor 200. The through-hole 200T may overlap the above-described through-hole 100T (refer to FIG. 3) of the display panel 100 (refer to FIG. 3) on a plane.

The through-hole 200T may be provided by removing all components of the input sensor 200.

The input sensor 200 may include a base insulation layer 200-1, first sensing electrodes 210, second sensing electrodes 220, first sensing lines 231, second sensing lines 232, a crack detection pattern 310, a first connection line 321, a second connection line 322, a first crack detection line 331, and a second crack detection line 332.

The first sensing electrodes 210 and the second sensing electrodes 220 may be disposed on the active area 200A, and the first sensing lines 231, the second sensing lines 232, the first crack detection line 331, and the second crack detection line 332 may be disposed on the peripheral area 200N. The crack detection pattern 310 may be disposed in a hole area HA (refer to FIG. 5) around the through-hole 200T. The first sensing lines 231, the second sensing lines 232, the first crack detection line 331, and the second crack detection line 332 may be electrically connected to the plurality of sensing pads 160 (refer to FIG. 3) through a contact hole. The first connection line 321 and the second connection line 322 may be located in the active area 200A and extend to the peripheral area 200N.

The input sensor 200 may obtain information about an external input through variation of mutual capacitance between the first sensing electrodes 210 and the second sensing electrodes 220. The first sensing electrodes 210 may be arranged in the first direction DR1, and each of the first sensing electrodes 210 may extend in the second direction DR2. The first sensing electrodes 210 may include first sensing patterns 211 and first connection patterns 212. The first connection patterns 212 may electrically connect two neighboring first sensing patterns 211 to each other. For example, in FIG. 4, two first connection patterns 212 may connect two diamond shaped first sensing patterns 211 to each other. Although the two neighboring first sensing patterns 211 may be connected to each other by two first connection patterns 212, the inventive concept is not limited thereto. For example, a single first connection pattern 212 may connect the two neighboring first sensing patterns 211 to each other.

Each of the second sensing electrodes 220 may extend in the first direction DR1, and each of the second sensing electrodes 220 may be arranged in the second direction DR2. The second sensing electrodes 220 may include second sensing patterns 221 and second connection patterns 222. The second connection patterns 222 may electrically connect two neighboring second sensing patterns 221 to each other. Two first connection patterns 212 and one second connection pattern 222 may cross each other in an insulating manner.

Although shapes and an arrangement relationship of the first sensing electrodes 210 and the second sensing electrodes 220 are exemplarily illustrated in FIG. 4, the inventive concept is not limited thereto.

The first sensing lines 231 may be electrically connected to the first sensing electrodes 210, respectively. For example, two first sensing lines 231 may be connected to one end and the other end of one first sensing electrode 210, respectively. The second sensing lines 232 may be electrically connected to the second sensing electrodes 220, respectively. Although a connection relationship between the first sensing lines 231 and the first sensing electrodes 210 and a connection relationship between the second sensing lines 232 and the second sensing electrodes 220 are exemplarily illustrated in FIG. 4, the inventive concept is not limited thereto.

The crack detection pattern 310 may be disposed around the through-hole 200T. The crack detection pattern 310 may have a shape surrounding at least a portion of the through-hole 200T. As an example, the crack detection pattern 310 may have a first portion on a first side of the through-hole 200T and a second portion separated from the first portion on a second side of the through-hole 200T, the second side being opposite the first side. The crack detection pattern 310 may include a conductive material and thus have a conductivity.

The crack detection pattern 310 may have one end connected to a first connection line 321 and the other end connected to a second connection line 322. In other words, the crack detection pattern 310 may have a first end connected to a first connection line 321 and a second end connected to a second connection line 322. The first connection line 321 may electrically connect the crack detection pattern 310 and the first crack detection line 331, and the second connection line 322 may electrically connect the crack detection pattern 310 and the second crack detection line 332.

According to an embodiment of the inventive concept, whether a crack is generated around the through-hole 200T and around the peripheral area 200N may be determined by using the crack detection pattern 310, the first connection line 321, the second connection line 322, the first crack detection line 331, and the second crack detection line 332.

Figure 5:
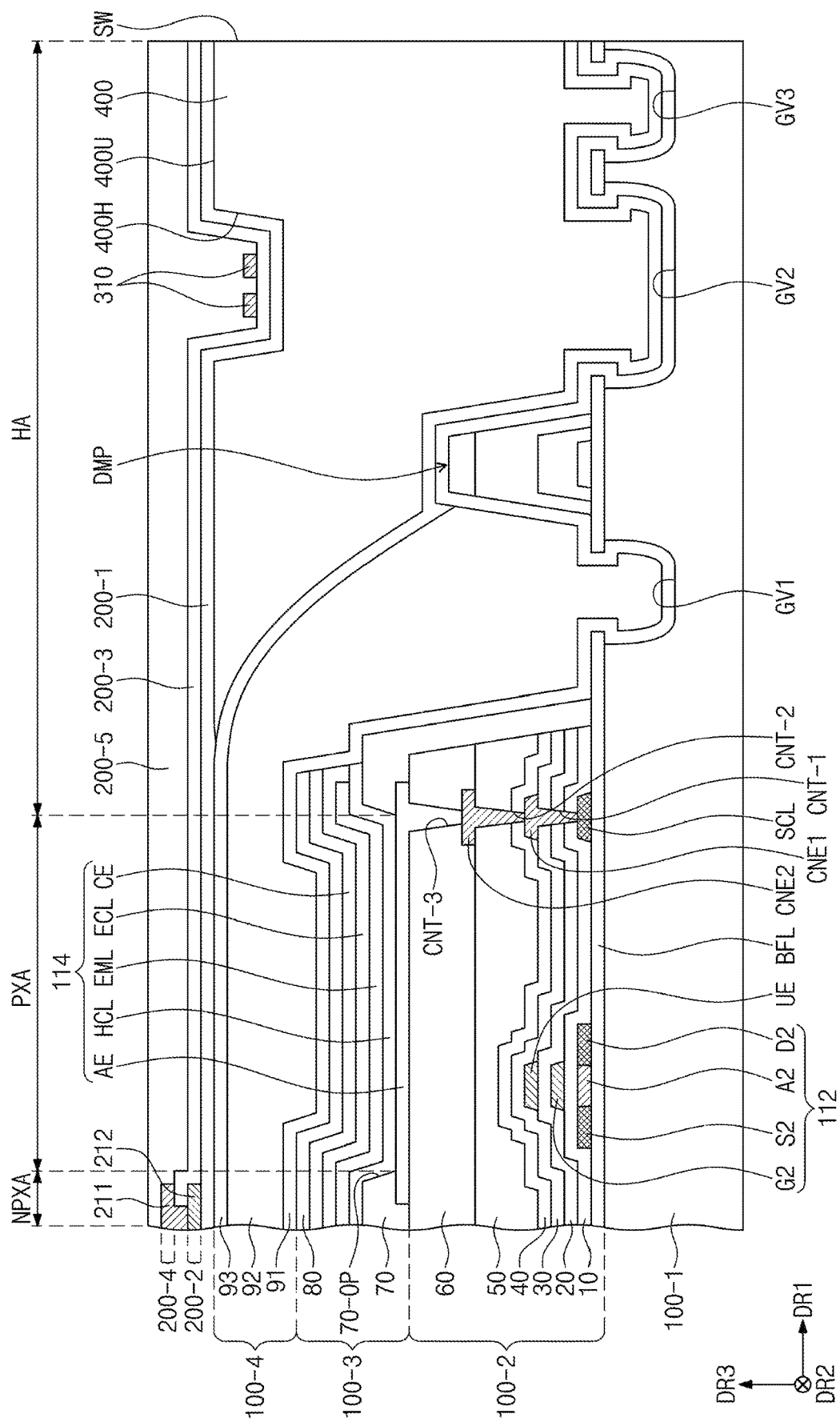
FIG. 5 is a cross-sectional view illustrating a display device according to an embodiment of the inventive concept.

FIG. 5 is a cross-sectional view illustrating the display device according to an embodiment of the inventive concept.

Referring to FIGS. 3, 4, and 5, the display device 1000 may include the display panel 100 and the input sensor 200. The through-hole 100T of the display panel 100 and the through-hole 200T of the input sensor 200 may overlap each other. The through-hole 100T and 200T may have a sidewall SW, and the sidewall SW may be formed by removing a portion of each of the display panel 100 and the input sensor 200.

The display panel 100 may include a base layer 100-1, a circuit layer 100-2, a display element layer 100-3, and an encapsulation layer 100-4. Each of the circuit layer 100-2 and the display element layer 100-3 may include a plurality of insulation layers, a semiconductor pattern, a conductive pattern, a signal line, etc. The insulation layer, the semiconductor layer, and the conductive layer are provided by a method such as coating and deposition. Thereafter, the insulation layer, the semiconductor layer, and the conductive layer may be selectively patterned by a photolithography method. By using the above-described method, the semiconductor pattern, the conductive pattern, and the signal line, which are contained in the circuit layer 100-2 and the display element layer 100-3, are provided. Thereafter, the encapsulation layer 100-4 covering the display element layer 100-3 may be provided.

A plurality of base grooves GV1, GV2, and GV3 may be provided in the base layer 100-1. Although the plurality of base grooves GV1, GV2, and GV3 exemplarily include a first base groove GV1, a second base groove GV2, and a third base groove GV3 in FIG. 5, the inventive concept is not limited to the number of the base grooves GV1, GV2, and GV3.

Each of the plurality of base grooves GV1, GV2, and GV3 may have a shape recessed from a top surface of the base layer 100-1. When viewed from a plane, each of the plurality of base grooves GV1, GV2, and GV3 may have a shape surrounding the sidewall SW of the through-hole 100T. The first to third base grooves GV1, GV2, and GV3 may block a penetration path of oxygen or external moisture to prevent elements disposed in the active area 100A (refer to FIG. 3) from being damaged.

At least one inorganic layer is provided on the top surface of the base layer 100-1. The inorganic layer may include at least one of an aluminum oxide, a titanium oxide, a silicon oxide, a silicon oxynitride, a zirconium oxide, and a hafnium oxide. The inorganic layer may have multiple layers. The multilayered inorganic layer may provide a barrier layer and/or a buffer layer. In this embodiment, the display panel 100 includes a buffer layer BFL.

The buffer layer BFL increases a coupling force between the base layer 100-1 and the semiconductor pattern. The buffer layer BFL may include a silicon oxide layer and a silicon nitride layer. Here, the silicon oxide layer and the silicon nitride layer may be alternately laminated with each other.

The semiconductor pattern is disposed on the buffer layer BFL. The semiconductor pattern may include polysilicon. However, the inventive concept is not limited thereto. For example, the semiconductor pattern may include amorphous silicon, low temperature polycrystalline silicon, or oxide semiconductor.

FIG. 5 illustrates a portion of the semiconductor pattern. The semiconductor pattern may be further disposed on another area. For example, the semiconductor pattern may be arranged over the pixels 110. The semiconductor pattern may have an electrical property that is different according to whether it is entirety doped, partially doped or not. The semiconductor pattern may include a doped area and a non-doped area. The doped area may be doped with an n-type dopant or a p-type dopant. A p-type (e.g., PMOS) transistor may include a doped area that is doped with the p-type dopant, and an n-type (e.g., NMOS) transistor may include a doped area that is doped with the n-type dopant.

The doped area may have a conductivity greater than that of the non-doped area and serve as an electrode or a signal line. The non-doped area may correspond to an active (or channel) of the transistor. In other words, one portion of the semiconductor pattern may be the active of the transistor, another portion of the semiconductor pattern may be a source or a drain of the transistor, and another portion of the semiconductor pattern may be a connection electrode or a connection signal line.

As illustrated in FIG. 5, a source S2, an active A2, and a drain D2 of the second transistor 112 may be provided from the semiconductor pattern. The source S2 and the drain D2 may extend from the active A2 in opposite directions on a cross-section. FIG. 5 illustrates a portion of a connection signal line SCL provided from the semiconductor pattern. The connection signal line SCL may be connected to the drain D2 of the second transistor 112 on a plane.

A first insulation layer 10 may be disposed on the buffer layer BFL. The first insulation layer 10 may overlap the plurality of pixels 110 in common and cover the semiconductor pattern. The first insulation layer 10 may be an inorganic layer and/or an organic layer and have a single-layer or multilayer structure. The first insulation layer 10 may include at least one of an aluminum oxide, a titanium oxide, a silicon oxide, a silicon oxynitride, a zirconium oxide, and a hafnium oxide. In this embodiment, the first insulation layer 10 may be a single-layered silicon oxide layer. In addition to the first insulation layer 10, an insulation layer of the circuit layer 100-2 may be an inorganic layer and/or an organic layer and have a single-layer or multilayer structure. Although the inorganic layer may include at least one of the above-described materials, the inventive concept is not limited thereto.

A gate G2 is disposed on the first insulation layer 10. The gate G2 may be a portion of a metal pattern. The gate G2 overlaps the active A2. The gate G2 may function as a mask in a process of doping the semiconductor pattern.

The second insulation layer 20 may be disposed on the first insulation layer 10 to cover the gate G2. The second insulation layer 20 may overlap the pixels 110 in common. The second insulation layer 20 may be an inorganic layer and/or an organic layer and have a single-layer or multilayer structure. In this embodiment, the second insulation layer 20 may be a single-layered silicon oxide layer.

An upper electrode UE may be disposed on the second insulation layer 20. The upper electrode UE may overlap the gate G2 of the second transistor 112. The upper electrode UE may be a portion of the metal pattern. A portion of the gate G2 and the upper electrode UE overlapping the same may form the capacitor 113. In an embodiment of the inventive concept, the upper electrode UE may be omitted.

A third insulation layer 30 may be disposed on the second insulation layer 20 to cover the upper electrode UE. In this embodiment, the third insulation layer 30 may be a single-layered silicon oxide layer.

A first connection electrode CNE1 may be disposed on the third insulation layer 30. The first connection electrode CNE1 may be connected to the connection signal line SCL through a contact hole CNT-1 passing through the first to third insulation layers 10 to 30.

A fourth insulation layer 40 may be disposed on the third insulation layer 30. The fourth insulation layer 40 may be a single-layered silicon oxide layer. A fifth insulation layer 50 may be disposed on the fourth insulation layer 40. The fifth insulation layer 50 may be an organic layer.

A second connection electrode CNE2 may be disposed on the fifth insulation layer 50. The second connection electrode CNE2 may be connected to the first connection electrode CNE1 through a contact hole CNT-2 passing through the fourth insulation layer 40 and the fifth insulation layer 50.

A sixth insulation layer 60 may be disposed on the fifth insulation layer 50 to cover the second connection electrode CNE2. The sixth insulation layer 60 may be an organic layer.

A protruding portion DMP may be disposed between the first base groove GV1 and the second base groove GV2. The protruding portion DMP may be referred to as a dam portion. The protruding portion DMP may include a plurality of insulation layers. The protruding portion DMP may prevent an organic layer, which will be described later, from expanding. In addition, although one protruding portion DMP is exemplarily illustrated in FIG. 5, the inventive concept is not limited to just one protruding portion DMP.

The display element layer 100-3 including the light emitting element 114 may be disposed on the circuit layer 100-2. The light emitting element 114 may include a first electrode AE, a hole control layer HCL, a light emitting layer EML, an electron control layer ECL, and a second electrode CE.

The first electrode AE may be disposed on the sixth insulation layer 60. The first electrode AE may be connected to the second connection electrode CNE2 through a contact hole CNT-3 passing through the sixth insulation layer 60. The first electrode AE may be an anode.

A pixel defining layer 70 may be disposed on the sixth insulation layer 60 to cover a portion of the first electrode AE. An opening 70-OP is provided in the pixel defining layer 70. The opening 70-OP of the pixel defining layer 70 exposes at least a portion of the first electrode AE.

As illustrated in FIG. 5, the active area 100A may include a pixel area PXA and a non-pixel area NPXA disposed adjacent to the pixel area PXA. The non-pixel area NPXA may surround the pixel area PXA. In this embodiment, the pixel area PXA may correspond to a portion of the first electrode AE exposed by the opening 70-OP.

The hole control layer HCL may be disposed on the first electrode AE. The hole control layer HCL may be disposed in common on the pixel area PXA and the non-pixel area NPXA. In other words, the hole control layer HCL may extend from the pixel area PXA to the non-pixel area NPXA. The hole control layer HCL may further include a hole transport layer and a hole injection layer.

The light emitting layer EML may be disposed on the hole control layer HCL. The light emitting layer EML may be disposed on an area corresponding to the opening 70-OP. In other words, the light emitting layer EML may be separately provided on each of the pixels 110 (refer to FIG. 3). However, the inventive concept is not limited thereto. For example, the light emitting layer EML may be disposed in common on the pixel area PXA and the non-pixel area NPXA. When the light emitting layer EML is separately provided on each of the pixels 110, the light emitting layer EML may emit light having at least one color of blue, red, and green. When the light emitting layer EML is disposed in common on the pixels 110 (refer to FIG. 3), the light emitting layer EML may provide blue light or white light.

The electron control layer ECL may be disposed on the light emitting layer EML. The electron control layer ECL may include an electron transport layer and further include an electron injection layer. The hole control layer HCL and the electron control layer ECL may be provided in common to the plurality of pixels 110 by using an open mask.

The second electrode CE may be disposed on the electron control layer ECL. The second electrode CE may have an integrated shape and be disposed in the plurality of pixels 110 (refer to FIG. 3) in common. The second electrode CE may be a cathode.

A capping layer 80 may be disposed on the second electrode CE to contact the second electrode CE. The capping layer 80 may include an organic material. The capping layer 80 may protect the second electrode CE from a following process. e.g., a sputtering process, and increase a light emitting efficiency of the light emitting element 114. Although the capping layer 80 may have a refractive index greater than that of a first inorganic layer 91, which will be described later, the inventive concept is not limited thereto. In an embodiment of the inventive concept, the capping layer 80 may be omitted.

The encapsulation layer 100-4 may be disposed on the display element layer 100-3. The encapsulation layer 100-4 may extend from the pixel area PXA to the hole area HA. The encapsulation layer 100-4 may include a first inorganic layer 91, an organic layer 92, and a second inorganic layer 93. The first inorganic layer 91, an organic layer 92, and a second inorganic layer 93 may be provided in the pixel area PXA while the first and second inorganic layers 91 and 93 may be provided in the hole area HA. The first inorganic layer 91 and the second inorganic layer 93 protect the display element layer 100-3 from oxygen and moisture, and the organic layer 92 protects the display element layer 100-3 from foreign substances such as dust particles. Each of the first inorganic layer 91 and the second inorganic layer 93 may include a silicon nitride layer, a silicon oxynitride layer, a silicon oxide layer, a titanium oxide layer, or an aluminum oxide layer. Although the organic layer 92 may include an acrylic-based organic layer, the inventive concept is not limited thereto.

In an embodiment of the inventive concept, an inorganic layer, e.g., a LiF layer, may be further provided between the capping layer 80 and the first inorganic layer 91. The LiF layer may increase the light emitting efficiency of the light emitting element 114.

A compensation layer 400 may be disposed on the encapsulation layer 100-4. For example, the compensation layer 400 may be disposed in the hole area HA that surrounds a peripheral portion of each of the through-holes 100T and 200T and the compensation layer 400 may surround the peripheral portion of each of the through-hole 100T and 200T. The compensation layer 400 may include an organic material. The compensation layer 400 may cover a non-flat surface defined by the protruding portion DMP or the first to third base grooves GV1, GV2, and GV3 to provide a flat surface thereon. For example, the compensation layer 400 may cover the first and second inorganic layers 91 and 93 on the protruding portion DMP an in the second and third base grooves GV2 and GV3. The compensation layer 400 may also cover the elements of the encapsulation layer 100-4 over the first base groove GV1. Thus, the flat surface may be provided at an area adjacent to the through-holes 100T and 200T and on which the organic layer 92 is not provided.

A groove 400H may be provided in the compensation layer 400. The groove 400H may be provided by removing a portion of the compensation layer 400 in a thickness direction thereof, e.g., the third direction DR3. The groove 400H may be provided by a half mask or a slit mask in a process of patterning the compensation layer 400. The groove 400H may have a shape recessed from a top surface 400U of the compensation layer 400. When viewed from a plane, the groove 400H may have a shape surrounding at least a portion of the sidewall SW. For example, the groove 400H may be disposed in an area corresponding the second base groove GV2 and an area corresponding to the third base groove GV3 may be located between the groove 400H and the sidewall SW.

The input sensor 200 may be disposed on the display panel 100 and the compensation layer 400. The input sensor 200 may include a base insulation layer 200-1, a first conductive layer 200-2, a sensing insulation layer 200-3, a second conductive layer 200-4, and a cover insulation layer 200-5. The input sensor 200 may be provided by a continuous process after the display panel 100 is provided. However, the inventive concept is not limited thereto.

The base insulation layer 200-1 may be disposed directly on the display panel 100. For example, the base insulation layer 200-1 may directly contact the second inorganic layer 93. The base insulation layer 200-1 may have a single-layer or multilayer structure.

Each of the first conductive layer 200-2 and the second conductive layer 200-4 may have a single-layer structure or a multilayer structure laminated in the third direction DR3. The single-layered conductive layer may include a metal layer or a transparent conductive layer. When each of the first conductive layer 200-2 and the second conductive layer 200-4 includes an opaque metal layer, each of the first sensing patterns 211, the second sensing patterns 221, the second connection patterns 222, the first connection line 321, and the second connection line 322 may have a mesh structure.

The metal layer may include molybdenum, silver, titanium, copper, aluminum, and an alloy thereof. The transparent conductive layer may include a transparent conductive oxide such as an indium tin oxide (ITO), an indium zinc oxide (IZO), a zinc oxide (ZnO), or an indium zinc tin oxide (IZTO). The transparent conductive layer may also include a conductive polymer such as PEDOT, a metal nano-wire, or graphene.

The multilayered conductive layer may include multilayered metal layers. The multilayered metal layers may have, e.g., a three-layer structure of titanium/aluminum/titanium. The multilayered metal layers may include at least one metal layer and at least one transparent conductive layer.

The first conductive layer 200-2 and the second conductive layer 200-4 may include first sensing patterns 211, first connection patterns 212, second sensing patterns 221, second connection patterns 222 (refer to FIG. 4), and a crack detection pattern 310. For example, the first conductive layer 200-2 may include the first connection patterns 212, and the second conductive layer 200-4 may include first sensing patterns 211, the second sensing patterns 221, the second connection patterns 222, and the crack detection pattern 310.

The second sensing patterns 221 and the second connection patterns 222, which are contained in one second sensing electrode 220 (refer to FIG. 4), may have an integrated shape connected to each other. Thus, each of the second sensing patterns 221 may be referred to as a first portion, and each of the second connection patterns 222 may be referred to as a second portion.

However, this is merely illustrative. For example, although each of the first conductive layer 200-2 and the second conductive layer 200-4 may include the above-described components, the inventive concept is not limited thereto. For example, the crack detection pattern 310 may be contained in the first conductive layer 200-2 instead of the second conductive layer 200-4 in the above-described inclusion relationship. Alternatively, the first conductive layer 200-2 may include the first sensing patterns 211, the second sensing patterns 221, the second connection patterns 222, and the crack detection pattern 310, and the second conductive layer 200-4 may include the first connection patterns 212.

The sensing insulation layer 200-3 may be disposed between the first conductive layer 200-2 and the second conductive layer 200-4 to cover the first conductive layer 200-2. Some components of the second conductive layer 200-4 may be electrically connected to some components of the first conductive layer 200-2 through a contact hole pasting through the sensing insulation layer 200-3. The cover insulation layer 200-5 may be disposed on the sensing insulation layer 200-3 to cover the second conductive layer 200-4.

At least one of the sensing insulation layer 200-3 and the cover insulation layer 200-5 may include an inorganic layer. The inorganic layer may include at least one of an aluminum oxide, a titanium oxide, a silicon oxide, a silicon oxynitride, a zirconium oxide, and a hafnium oxide.

At least one of the sensing insulation layer 200-3 and the cover insulation layer 200-5 may include an organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, or a perylene-based resin.

The crack detection pattern 310 may be disposed in the groove 400H of the compensation layer 400. The groove 400H may be formed by removing a portion of the compensation layer 400 in the thickness direction, e.g., the third direction DR3. Thus, one portion of the compensation layer 400 may be disposed between the crack detection pattern 310 and the base layer 100-1, and the crack detection pattern 310 may be disposed on the one portion of the compensation layer 400. The portion of the compensation layer 400 disposed between the crack detection pattern 310 and the base layer 100-1 may overlap the second base groove GV2.

When viewed from a cross-section, the crack detection pattern 310 may be disposed lower than the top surface 400U of the compensation layer 400. As the crack detection pattern 310 is disposed in the groove 400H, the crack detection pattern 310 may be positioned adjacent to a point having a high probability of crack occurrence. For example, the crack detection pattern 310 may be located adjacent to the sidewall SW of the through-holes 100T and 200T. Thus, a probability of a crack propagated to the crack detection pattern 310 may increase, and a crack detection sensitivity around the through-hole 100T and 200T may increase by the crack detection pattern 310 disposed in the groove 400H.

For example, a crack may occur in a layer adjacent to the sidewall SW in a process of forming the through-hole 100T and 200T, and the generated crack may be propagated to a peripheral area of the sidewall SW. When the generated crack reaches the crack detection pattern 310, the crack detection pattern 310 may be short-circuited or have an increased resistance, and this feature may be used for detecting a crack.

According to an embodiment of the inventive concept, since the crack detection pattern 310 is provided in the groove 400H, a distance between the crack detection pattern 310 and the second inorganic layer 93 may decrease. Thus, a probability in which a crack occurring in the second inorganic layer 93 is propagated to the crack detection pattern 310 may increase. In addition, since the crack detection pattern 310 is disposed lower than the top surface 400U of the compensation layer 400, a probability in which a crack propagated in the first direction DR1 in the compensation layer 400 is propagated to the crack detection pattern 310 may increase. Thus, the crack detection sensitivity of the crack detection pattern 310 may increase. Therefore, product reliability may increase.

According to an embodiment of the inventive concept shown in FIGS. 1 to 5, the display device 1000 may include a display panel 100 including a base layer 100-1, a circuit layer 100-2, a display element layer 100-3, and an encapsulation layer 100-4, wherein a through-hole 100T/200T passes through the base layer 100-1, the circuit layer 100-2, the display element layer 100-3 and the encapsulation layer 100-4; a compensation layer 400 disposed on the encapsulation layer 100-4, wherein the compensation layer 400 layer is adjacent to the through-hole 100T/200T; and a crack detection pattern 310 disposed in a groove 400H on a top surface 400U of the compensation layer 400.

Figure 6:
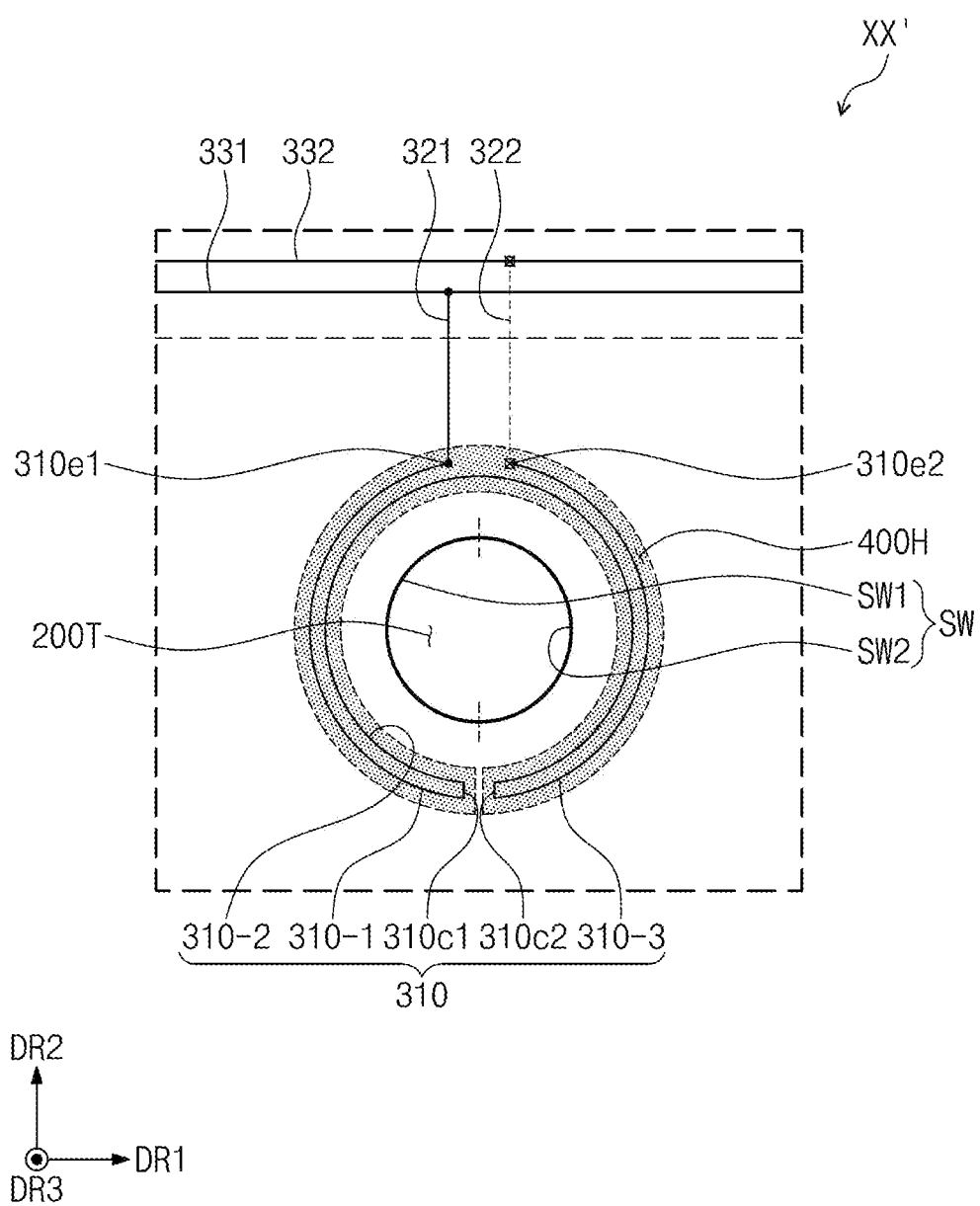
FIG. 6 is an enlarged plan view illustrating an area XX' in FIG. 4 according to an embodiment of the inventive concept.

FIG. 6 is an enlarged plan view illustrating an area XX' in FIG. 4 according to an embodiment of the inventive concept.

Referring to FIG. 6, the through-hole 200T may be defined by the sidewall SW. The sidewall SW may include a first sidewall SW1 and a second sidewall SW2, and a boundary between the first sidewall SW1 and the second sidewall SW2 is illustrated by a dotted line in the second direction DR2. The first sidewall SW1 and the second sidewall SW2 may be adjacent to each other and connected to each other.

The crack detection pattern 310 may include a first pattern portion 310-1, a second pattern portion 310-2, and a third pattern portion 310-3. The first pattern portion 310-1 may surround a portion of the first sidewall SW1. The second pattern portion 310-2 may be bent from the first pattern portion 310-1 and surround the first sidewall SW1 and the second sidewall SW2. For example, the second pattern portion 310-2 may be connected to the first pattern portion 310-1 near a break in the groove 400H and the second pattern portion 310-2 may be closer to the first sidewall SW1 than the first pattern portion 310-1. The third pattern portion 310-3 may be bent from the second pattern portion 310-2 and surround the second sidewall SW2. A portion of the second pattern portion 310-2 may be disposed between the first pattern portion 310-1 and the first sidewall SW1, and another portion of the second pattern portion 310-2 may be disposed between the third pattern portion 310-3 and the second sidewall SW2.

In the crack detection pattern 310, a first end 310e1 connected to the first connection line 321, a second end 310e2 connected to the second connection line 322, a first bent portion 310c1 between the first pattern portion 310-1 and the second pattern portion 310-2, and a second bent portion 310c2 between the second pattern portion 310-2 and the third pattern portion 310-3 may be provided. The first bent portion 310c1 and the second bent portion 310c2 may be spaced apart from each other while facing each other.

The first pattern portion 310-1 may extend from the first end 310e1 to the first bent portion 310c1 in a counter clockwise direction along a circumference of the first sidewall SW1. The second pattern portion 310-2 may extend from the first bent portion 310c1 to the second bent portion 310c2 in a clockwise direction along a circumference of each of the first sidewall SW1 and the second sidewall SW2. The third pattern portion 310-3 may extend from the second bent portion 310c2 to the second end 310e2 in a counter clockwise direction along a circumference of the second sidewall SW2.

The crack detection pattern 310, the first connection line 321, the first crack detection line 331, and the second crack detection line 332 may be contained in the second conductive layer 200-4 (refer to FIG. 5), and the second connection line 322 may be contained in the first conductive layer 200-2 (refer to FIG. 5). The first and second conductive layers 200-2 and 200-4 may be in contact with each other through a contact hole. Thus, for example, the second connection line 322 and the second crack detection line 332 may be electrically connected through a contact hole passing through the sensing insulation layer 200-3, and the second connection line 322 and the crack detection pattern 310 may be electrically connected through the contact hole passing through the sensing insulation layer 200-3.

The crack detection pattern 310 may be disposed in the groove 400H. Thus, when viewed from a plane, the crack detection pattern 310 may overlap the groove 400H. The groove 400H may have a shape surrounding a portion of the sidewall SW. For example, the groove 400H may not be provided in an area between the first bent portion 310c1 and the second bent portion 310c2. In the alternative, the groove 400H may be provided between the first bent portion 310c1 and the second bent portion 310c2.

The groove 400H may have a width greater than a sum of a width of the first pattern portion 310-1, a width of the second pattern portion 310-2, and a distance between the first pattern portion 310-1 and the second pattern portion 310-2. For example, a width of each of the first pattern portion 310-1, the second pattern portion 310-2, and the third pattern portion 310-3 may be about 4 µm, and a distance between the first pattern portion 310-1 and the second pattern portion 310-2 may be about 6 µm. In addition, a distance between the second pattern portion 310-2 and the third pattern portion 310-3 may be about 6 µm.

Figure 7:
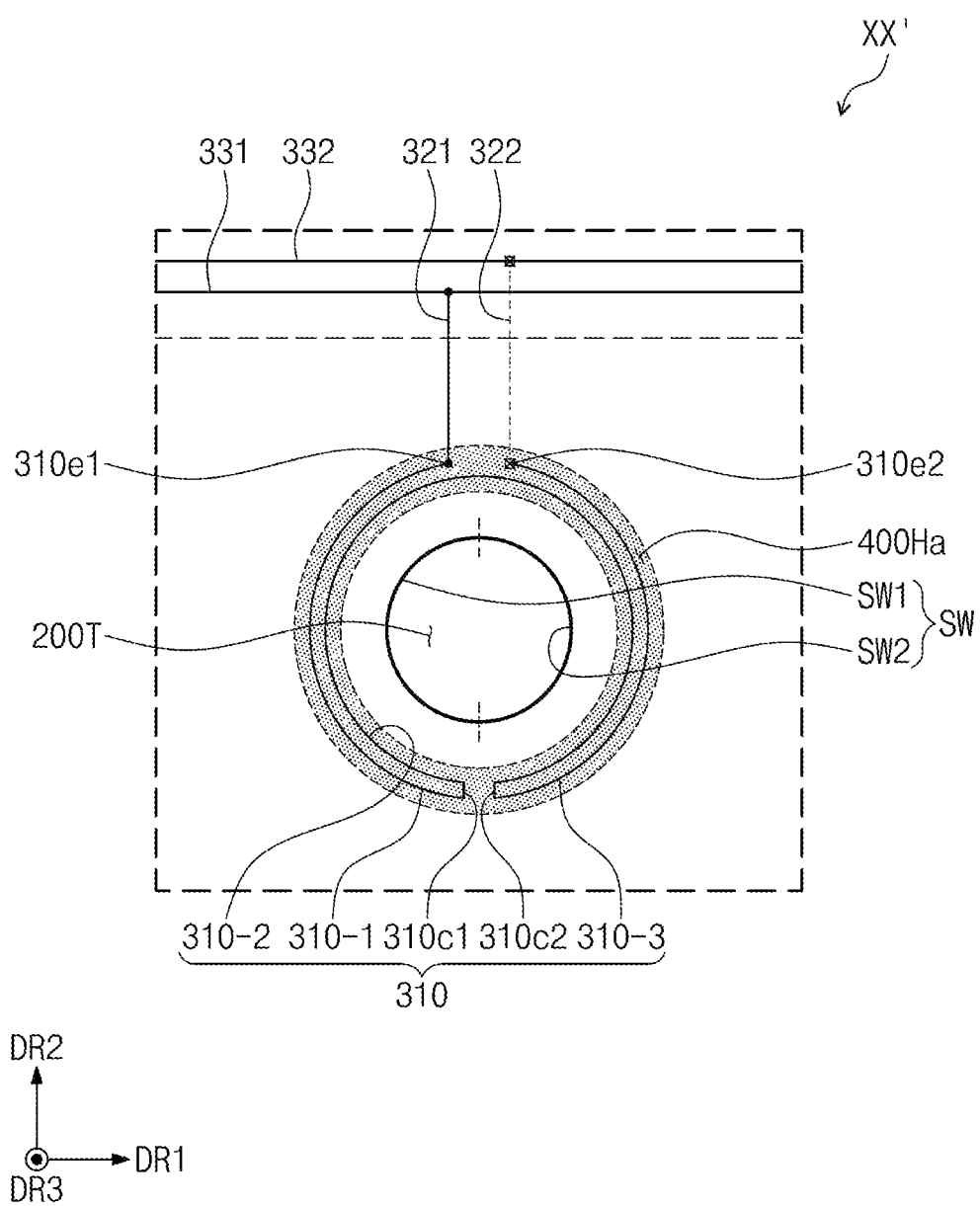
FIG. 7 is an enlarged plan view illustrating the area XX' in FIG. 4 according to another embodiment of the inventive concept.

FIG. 7 is an enlarged plan view illustrating the area XX' in FIG. 4 according to an embodiment of the inventive concept.

Referring to FIG. 7, a crack detection pattern 310 may be disposed in a groove 400Ha. The groove 400Ha may have a shape surrounding an entire sidewall SW. In other words, the groove 400Ha may have a closed curve shape.

Figure 8:
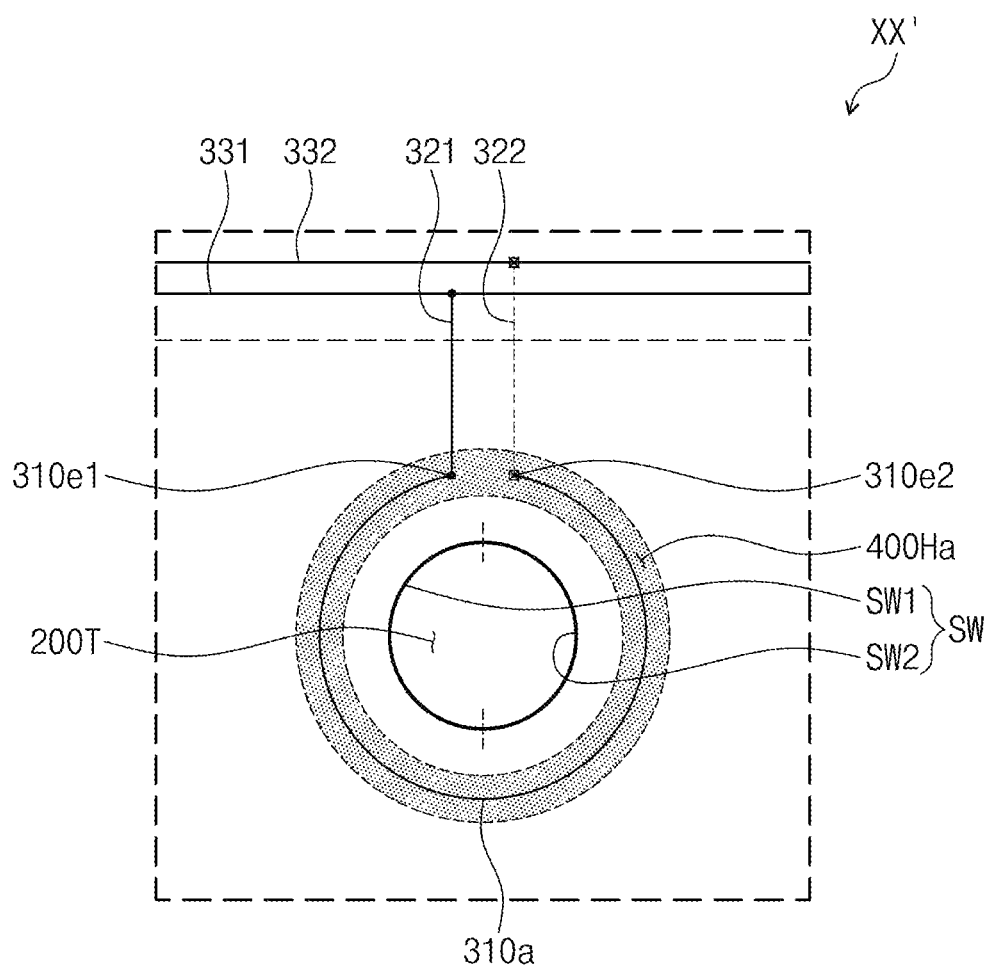
FIG. 8 is an enlarged plan view illustrating the area XX' in FIG. 4 according to another embodiment of the inventive concept.

FIG. 8 is an enlarged plan view illustrating the area XX' in FIG. 4 according to an embodiment of the inventive concept.

A crack detection pattern 310a may have a variously deformed shape, and one example thereof is illustrated in FIG. 8.

Figure 9:
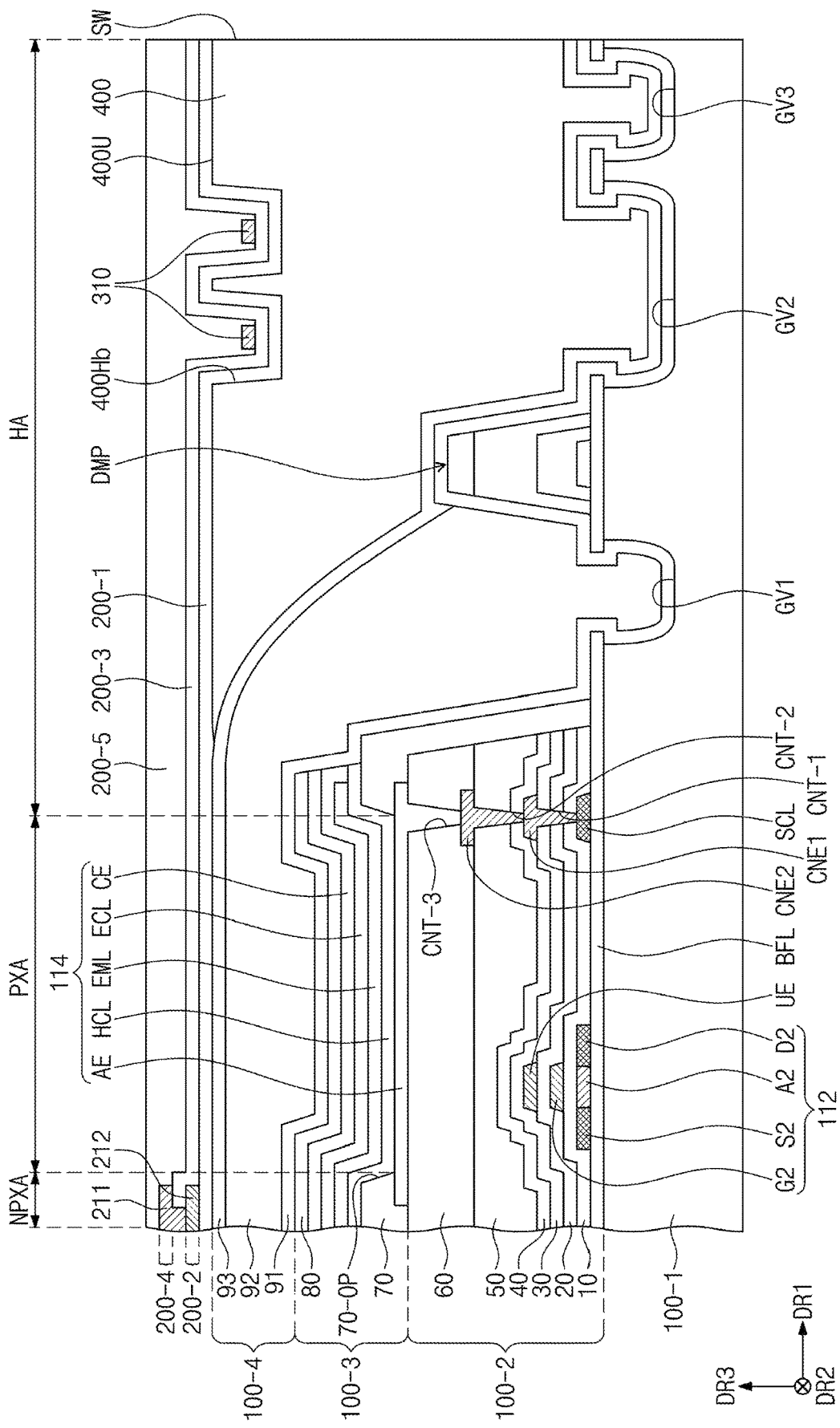
FIG. 9 is a cross-sectional view illustrating a display device according to an embodiment of the inventive concept.
Figure 10:
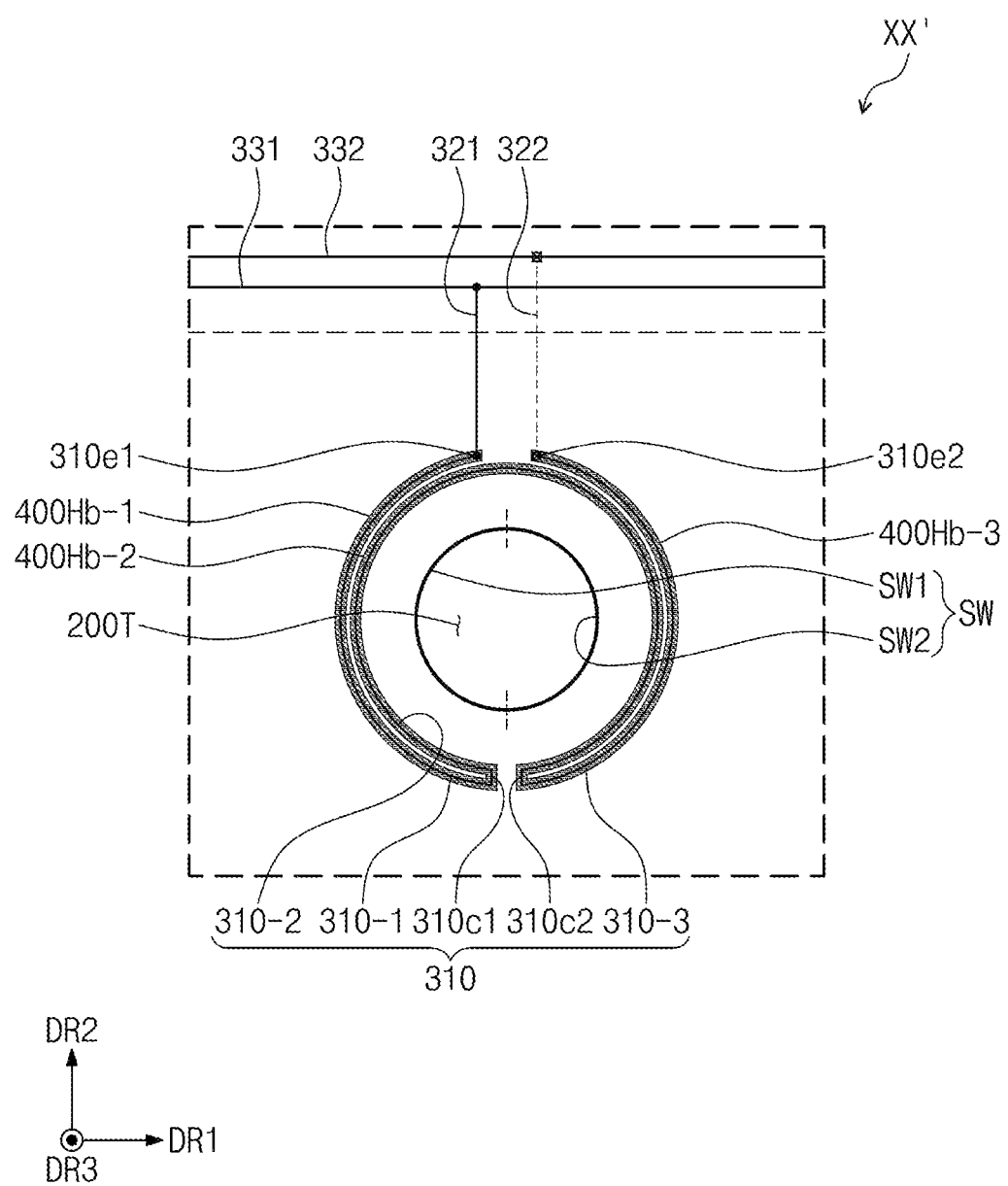
FIG. 10 is an enlarged plan view illustrating the area XX' in FIG. 4 according to another embodiment of the inventive concept.

Referring to FIG. 8, the crack detection pattern 310a may extend from a first end 310e1 to a second end 310e2 in a counter-clockwise direction along a circumference of each of a first sidewall SW1 and a second sidewall SW2. FIG. 9 is a cross-sectional view illustrating a display device according to an embodiment of the inventive concept. FIG. 10 is an enlarged plan view illustrating the area XX' in FIG. 4 according to an embodiment of the inventive concept.

Referring to FIGS. 9 and 10, a crack detection pattern 310 may be disposed in a groove 400Hb. When viewed from a plane, the groove 400Hb has a shape corresponding to that of the crack detection pattern 310.

The groove 400Hb may include a first groove portion 400Hb-1, a second groove portion 400Hb-2, and a third groove portion 400Hb-3. The first groove portion 400Hb-1 may surround a portion of a first sidewall SW1. The second groove portion 400Hb-2 may be bent from the first groove portion 400Hb-1 and surround a first sidewall SW1 and a second sidewall SW2. The third groove portion 400Hb-3 may be bent from the second groove portion 400Hb-2 and surround the second sidewall SW2. A portion of the second groove portion 400Hb-2 may be disposed between the first groove portion 400Hb-1 and the first sidewall SW1, and another portion of the second groove portion 400Hb-2 may be disposed between the third groove portion 400Hb-3 and the second sidewall SW2.

A first pattern portion 310-1 may be disposed in the first groove portion 400Hb-1, a second pattern portion 310-2 may be disposed in the second groove portion 400Hb-2, and a third pattern portion 310-3 may be disposed in the third groove portion 400Hb-3. A protruding portion may be disposed between the first pattern portion 310-1 and the second pattern portion 310-2 and between the second pattern portion 310-2 and the third pattern portion 310-3.

Figure 11:
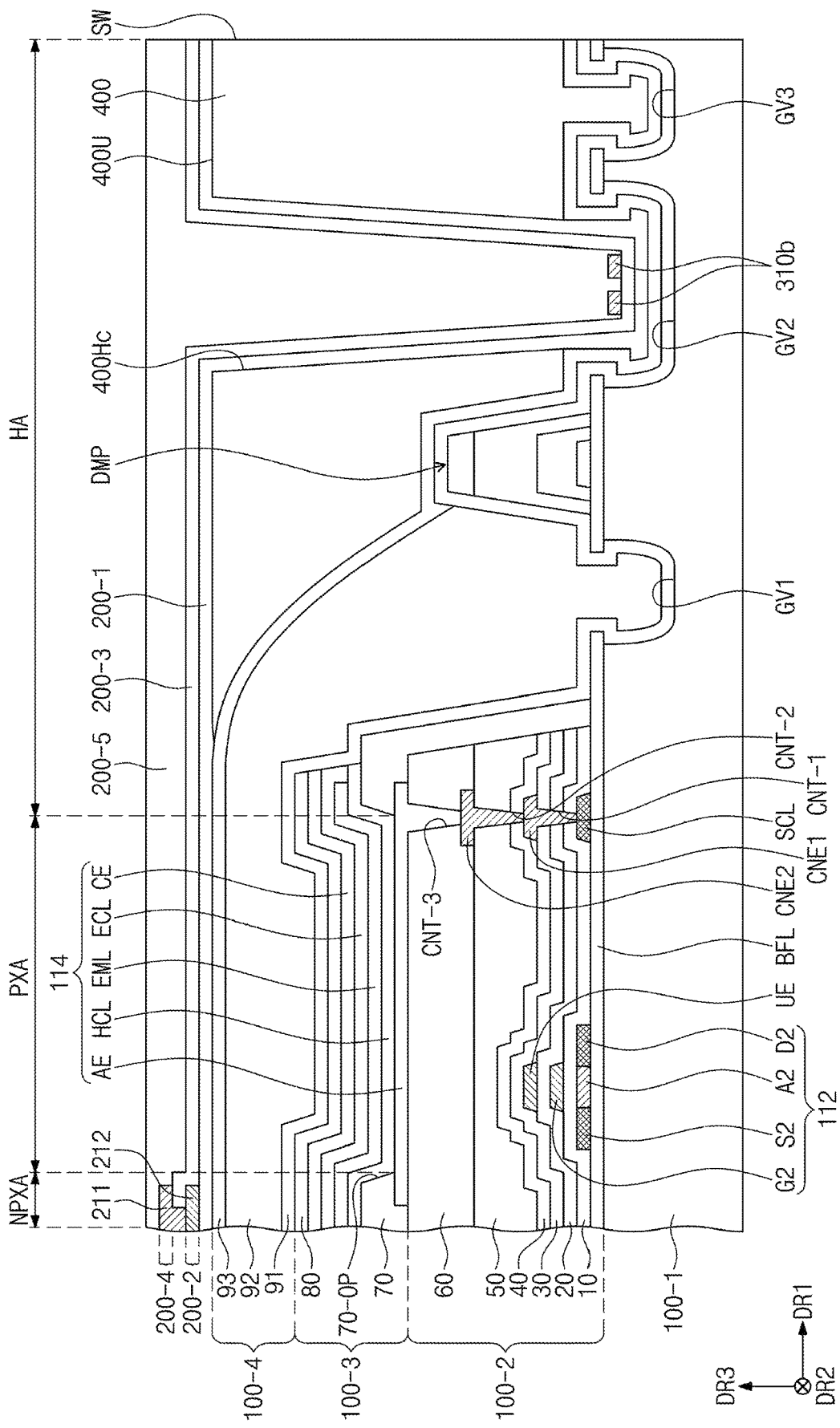
FIG. 11 is a cross-sectional view illustrating a display device according to an embodiment of the inventive concept.

FIG. 11 is a cross-sectional view illustrating a display device according to an embodiment of the inventive concept.

Referring to FIG. 11, a groove 400Hc may be provided in a compensation layer 400. The groove 400Hc may be provided by removing a portion of the compensation layer 400 in a thickness direction thereof, e.g., the third direction DR3.

The groove 400Hc may be provided by using a binary mask in a process of patterning the compensation layer 400. The groove 400Hc may have a shape recessed from a top surface 400U of the compensation layer 400.

When viewed from a plane, the groove 400Hc may overlap a second base groove GV2. The groove 400lHc may extend inside the second base groove GV2, and a crack detection pattern 310b may be disposed in the second base groove GV2. For example, in second base groove GV2, the base insulation layer 200-1 may be in direct contact with the second inorganic layer 93 without the compensation layer 400 therebetween.

Since the crack detection pattern 310b is disposed in an area obtained by removing one entire portion of the compensation layer 400, the crack detection pattern 310b and the compensation layer 400 may not overlap each other when viewed from a plane. In addition, when viewed from the plane, the crack detection pattern 310b may be spaced apart from the compensation layer 400.

According to embodiments of the inventive concept, the groove (e.g., 400H) may be provided in the compensation layer 400 disposed around the through-hole (e.g., 100T and 200T) to provide the flat top surface. The crack detection pattern (e.g., 310) for detecting the crack around the through-hole may be disposed in the groove of the compensation layer. Since the groove is provided by removing a portion or all of the compensation layer in the thickness direction from the top surface thereof, the crack detection pattern may be disposed lower than the top surface of the compensation layer. As the crack detection pattern is disposed in the groove, the probability of the crack propagated to the crack detection pattern may increase. Thus, the crack detection sensitivity around the through-hole may increase.

While the inventive concept has been described with reference to embodiments thereof, it is understood that various changes and modifications can be made thereto without departing from the spirit and scope of the inventive concept as hereinafter claimed.

What is claimed is:

1. A display device, comprising:
   a display panel comprising a base layer, a circuit layer, a display element layer, and an encapsulation layer, wherein a through-hole passes through the base layer, the circuit layer, the display element layer and the encapsulation layer;
   a compensation layer disposed on the encapsulation layer, wherein the compensation layer is adjacent to the through-hole; and
   a crack detection pattern disposed in a groove on a top surface of the compensation layer,
   wherein the groove is defined by removing at least a portion of the compensation layer in a thickness direction of the compensation layer,
   wherein the base layer comprises at least one base groove on a top surface of the base layer adjacent to the through-hole, and the crack detection pattern overlaps the at least one base groove.

2. The display device of claim 1, wherein a portion of the compensation layer is disposed between the crack detection pattern and the base layer.

3. The display device of claim 1, wherein the groove is defined by removing a whole of the portion of the compensation layer in the thickness direction of the compensation layer, and
   wherein the crack detection pattern does not overlap the compensation layer when viewed from the top surface of the compensation layer.

4. The display device of claim 1, wherein the groove is defined by removing a whole of the portion of the compensation layer in the thickness direction of the compensation layer, and
   wherein the crack detection pattern is disposed in the at least one base groove.

5. The display device of claim 1, wherein the through-hole includes a first sidewall and a second sidewall adjacent to the first sidewall, and
   the crack detection pattern comprises a first pattern portion disposed around the first sidewall, a second pattern portion connected to the first pattern portion and disposed around the first sidewall and the second sidewall, and a third pattern portion connected to the second pattern portion and disposed around the second sidewall, wherein the second pattern portion is disposed between the first pattern portion and the first sidewall and between the third pattern portion and the second sidewall.

6. The display device of claim 5, wherein the first pattern portion, the second pattern portion, and the third pattern portion are disposed in the groove.

7. The display device of claim 5, wherein the groove comprises a first groove portion disposed around the first sidewall, a second groove portion connected to the first groove portion and disposed around the first sidewall and the second sidewall, and a third groove portion connected to the second groove portion and disposed around the second sidewall, wherein the first pattern portion is disposed in the first groove portion, the second pattern portion is disposed in the second groove portion, and the third pattern portion is disposed in the third groove portion.

8. The display device of claim 1, wherein the groove surrounds the entire through-hole.

9. The display device of claim 1, wherein the groove surrounds only a portion of the through-hole.

10. The display device of claim 1, wherein an active area configured to display an image and a peripheral area adjacent to the active area are provided on the display panel, and the through-hole is surrounded by the active area.

11. The display device of claim 10, further comprising:
a first crack detection line connected to the crack detection pattern;
a second crack detection line connected to the crack detection pattern;
a first connection line connected to the crack detection pattern and the first crack detection line; and
a second connection line connected to the crack detection pattern and the second crack detection line.

12. The display device of claim 1, further comprising:
a first sensing electrode disposed on the display panel and comprising first sensing patterns and a first connection pattern connected to the first sensing patterns; and
a second sensing electrode disposed on the display panel and comprising second sensing patterns and a second connection pattern disposed on a different layer from the first connection pattern and connected to the second sensing patterns,
wherein the crack detection pattern is disposed on the same layer as the first connection pattern or the second connection pattern.

13. A display device, comprising:
a display panel comprising a base layer, a circuit layer, a display element layer, and an encapsulation layer, wherein a through-hole passes through the base layer, the circuit layer, the display element layer and the encapsulation layer;
a compensation layer disposed on the display panel and surrounding the through-hole; and
an input sensor comprising a crack detection pattern disposed in a groove at a top surface of the compensation layer and a plurality of sensing electrodes,
wherein the groove is defined by removing at least a portion of the compensation layer in a thickness direction of the compensation layer,
wherein the base layer comprises a plurality of base grooves at a top surface of the base layer, and the crack detection pattern overlaps one base groove of the plurality of base grooves.

14. The display device of claim 13, wherein the plurality of sensing electrodes comprise a first sensing electrode comprising first sensing patterns and a first connection pattern connected to the first sensing patterns and a second sensing electrode comprising second sensing patterns and a second connection pattern disposed on a different layer from the first connection pattern and connected to the second sensing patterns,
wherein the crack detection pattern is disposed on the same layer as the first connection pattern or the second connection pattern.

15. The display device of claim 13, wherein in a direction from the top surface of the compensation layer to the base layer, the groove overlaps the compensation layer or does not overlap the compensation layer.

16. The display device of claim 13, wherein the plurality of base grooves surround the through-hole.

17. The display device of claim 16, wherein the groove is defined by removing a whole of the portion of the compensation layer in the thickness direction of the compensation layer, and
wherein the crack detection pattern is disposed in the one base groove.

18. A display device, comprising:
a base layer including a hole;
a compensation layer disposed on the base layer and surrounding a peripheral portion of the hole, wherein the compensation layer includes a groove recessed from a top surface thereof;
a crack detection pattern disposed in the groove;
a first crack detection line connected to a first end of the crack detection pattern; and
a second crack detection line connected to a second end of the crack detection pattern,
wherein the groove overlaps a recess in the base layer.

19. The display device of claim 18, wherein the groove overlaps the compensation layer or does not overlap the compensation layer.

* * * * *